United States Patent [19]

Dalrymple

[11] Patent Number: 4,885,584
[45] Date of Patent: Dec. 5, 1989

[54] SERIALIZER SYSTEM WITH VARIABLE CHARACTER LENGTH CAPABILITIES

[75] Inventor: Monte J. Dalrymple, Fremont, Calif.
[73] Assignee: Zilog, Inc., Campbell, Calif.
[21] Appl. No.: 178,562
[22] Filed: Apr. 7, 1988
[51] Int. Cl.⁴ .............................................. H03M 9/00
[52] U.S. Cl. .................................... 341/101; 341/95; 341/87; 341/67
[58] Field of Search .................. 341/100, 101, 67, 87, 341/95, 107

[56] References Cited

U.S. PATENT DOCUMENTS

| | | | |
|---|---|---|---|
| 3,064,239 | 11/1962 | Svigals et al. | 341/101 |
| 3,334,181 | 8/1967 | Bartlett et al. | 341/101 |
| 4,568,916 | 2/1986 | Bahgat | 341/95 |
| 4,570,056 | 2/1986 | Hanson | 341/67 |
| 4,586,027 | 4/1986 | Tsukiyama et al. | 341/95 |
| 4,593,267 | 6/1986 | Kuroda et al. | 341/67 |
| 4,748,617 | 5/1988 | Drewlo | 370/85 |
| 4,813,056 | 3/1989 | Fedele | 341/107 |

*Primary Examiner*—A. D. Pellinen
*Assistant Examiner*—H. L. Williams
*Attorney, Agent, or Firm*—Majestic, Parsons, Siebet & Hsue

[57] ABSTRACT

In the serializer for converting parallel data into serial data, where the parallel data comprises normal characters all of the same length and a last character of a different length, the characters are each tagged by an extra bit as it enters a FIFO. This tag bit indicates the length of the character and is shifted along with the character as the character is shifted through the FIFO. The normal character length and the length of the last character are stored. As a character emerges from the FIFO, its tag bit identifies it as a normal character or as the last character. Such tag bit is used to select the correct character length in a counter. The character is loaded in a shifter which is controlled by the counter. Therefore, the shifter is controlled by the counter to shift the correct number of times in order to shift the character into a serial bit stream. Since each character carries along with it a bit which indicates its character length, the CPU is not called upon to intervene in a time critical manner to change the character length in the counter in order to correctly control the shifting of the shifter. Hence messages of arbitrary bit length can be transmitted without the normal CPU intervention at the end of the message.

10 Claims, 7 Drawing Sheets

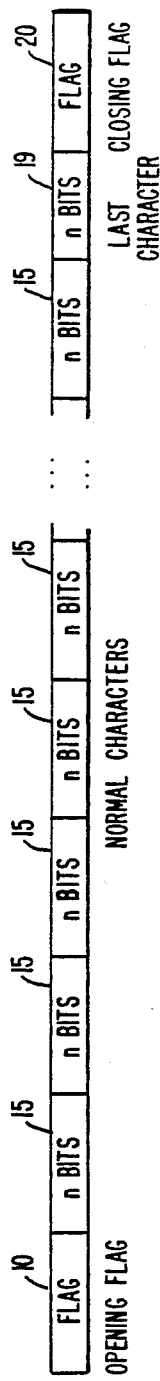
FIG._1.
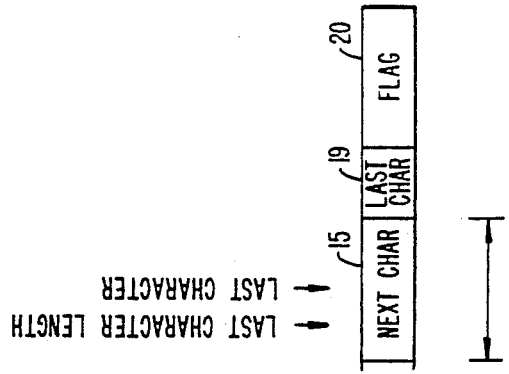
FIG._3. PRIOR ART
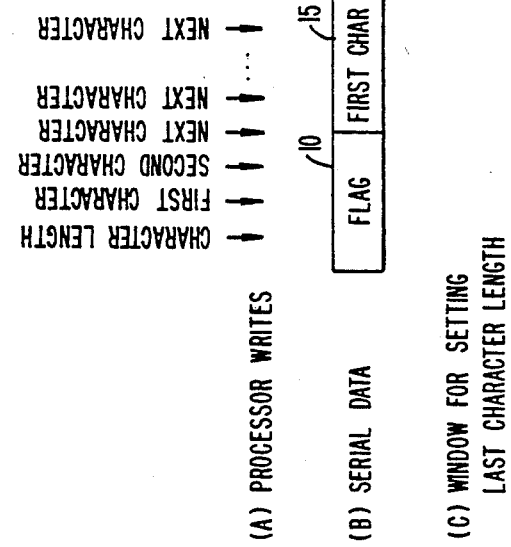

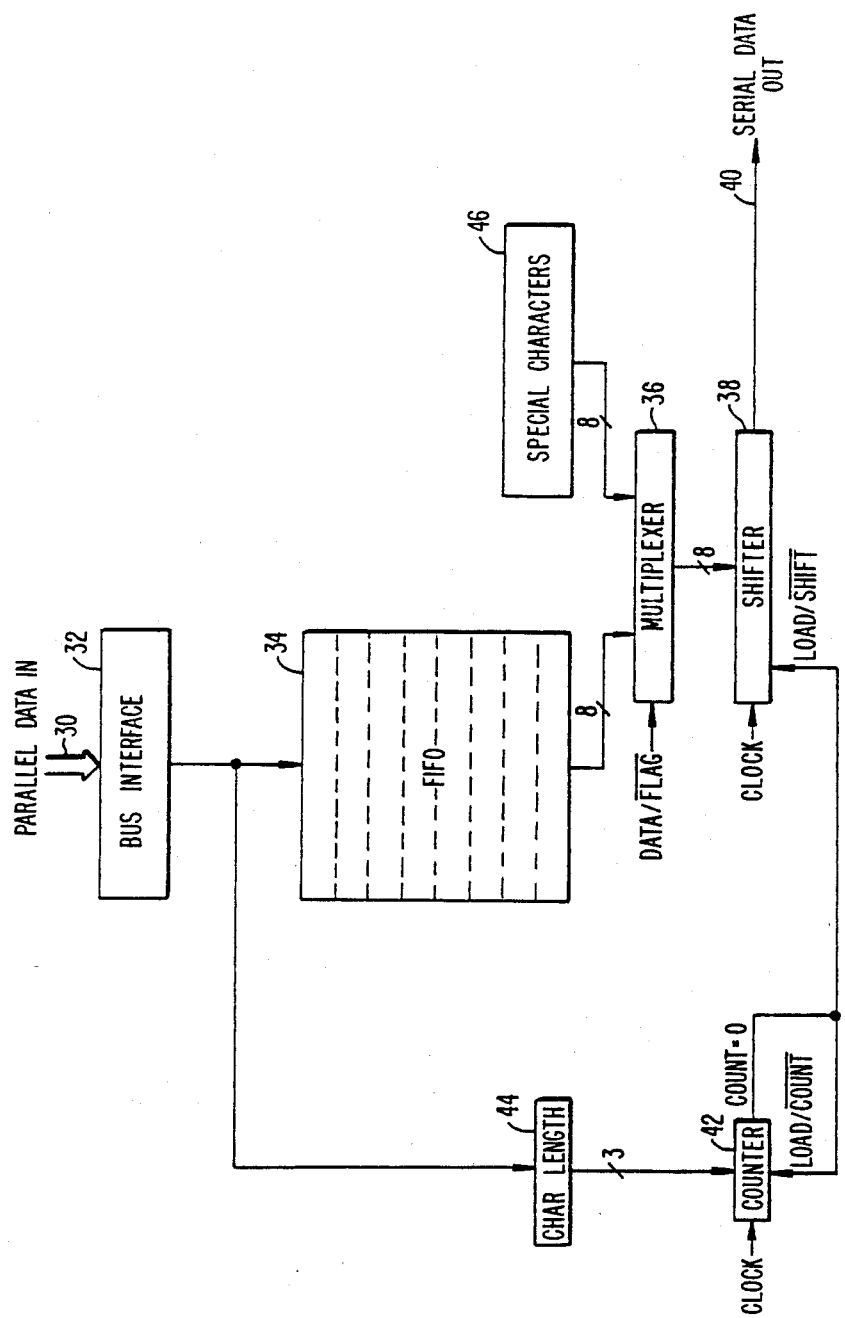
FIG._2.

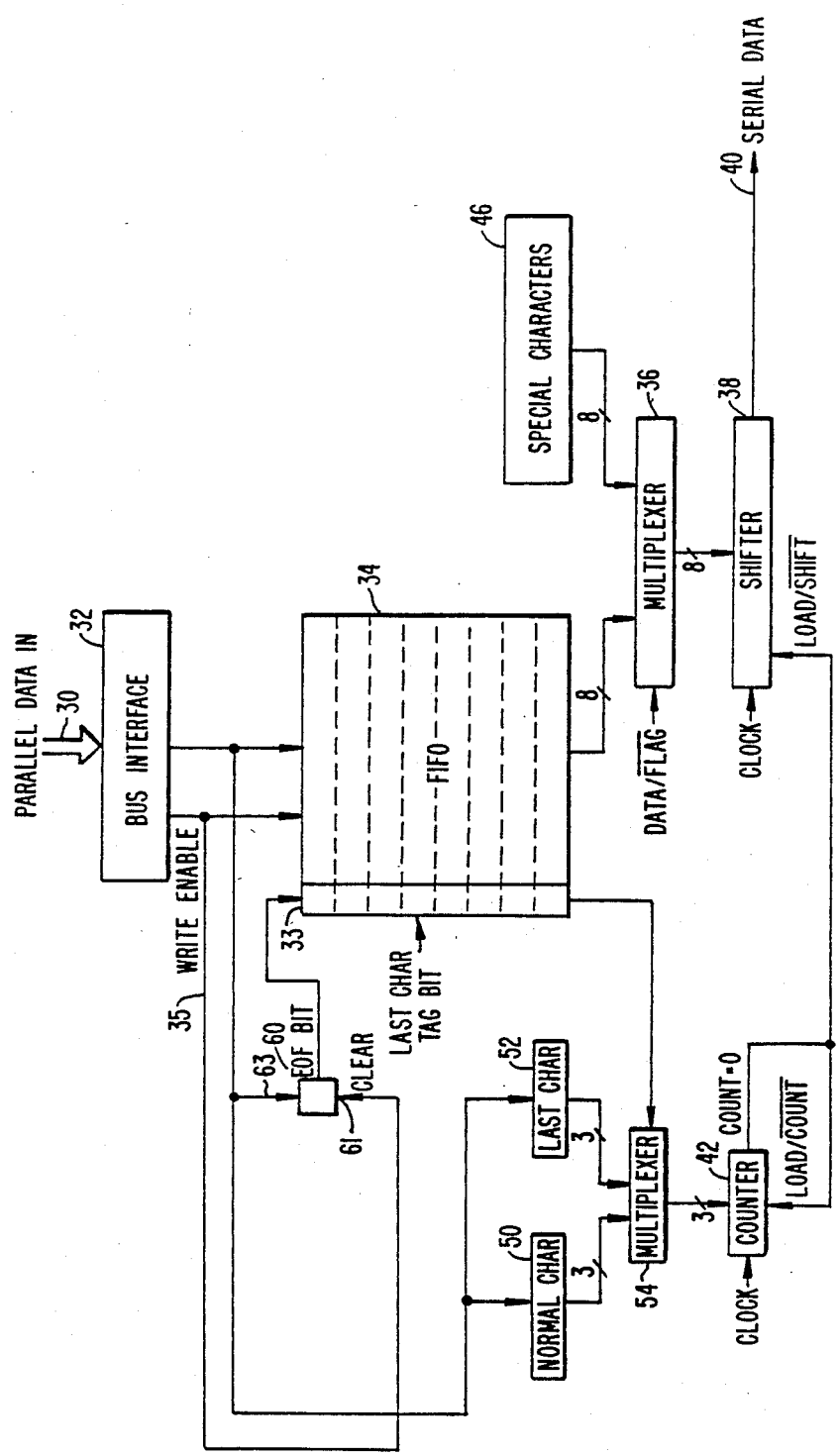
FIG._4.

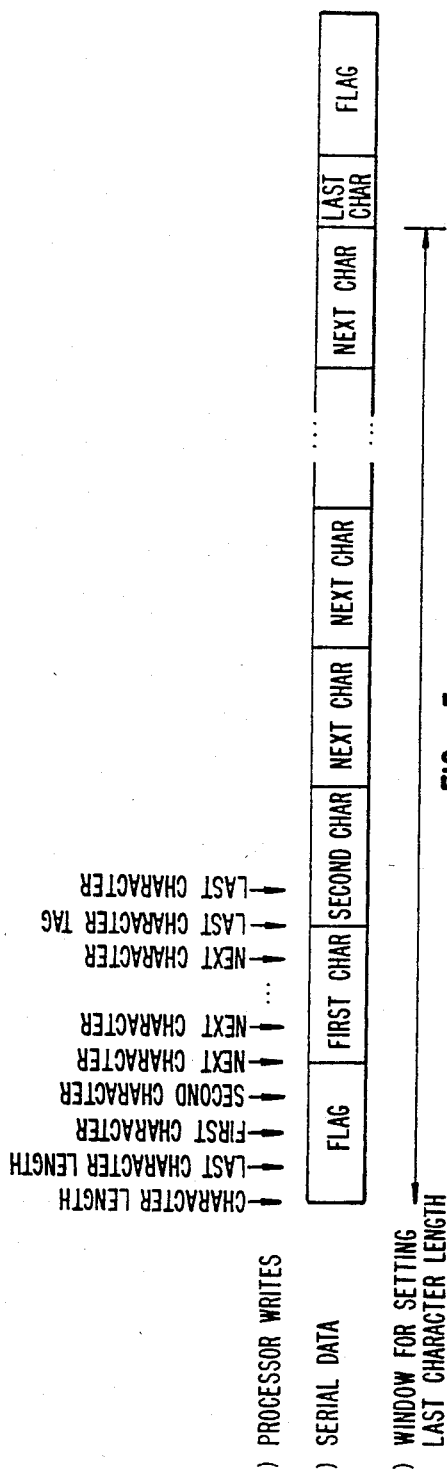
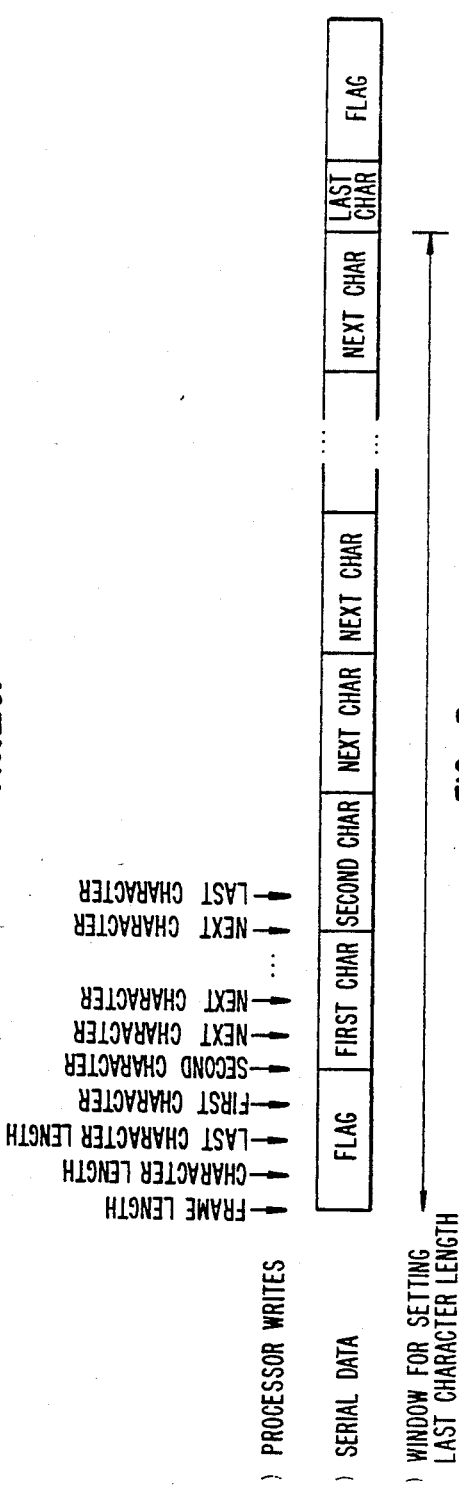
FIG._5.
FIG._7.

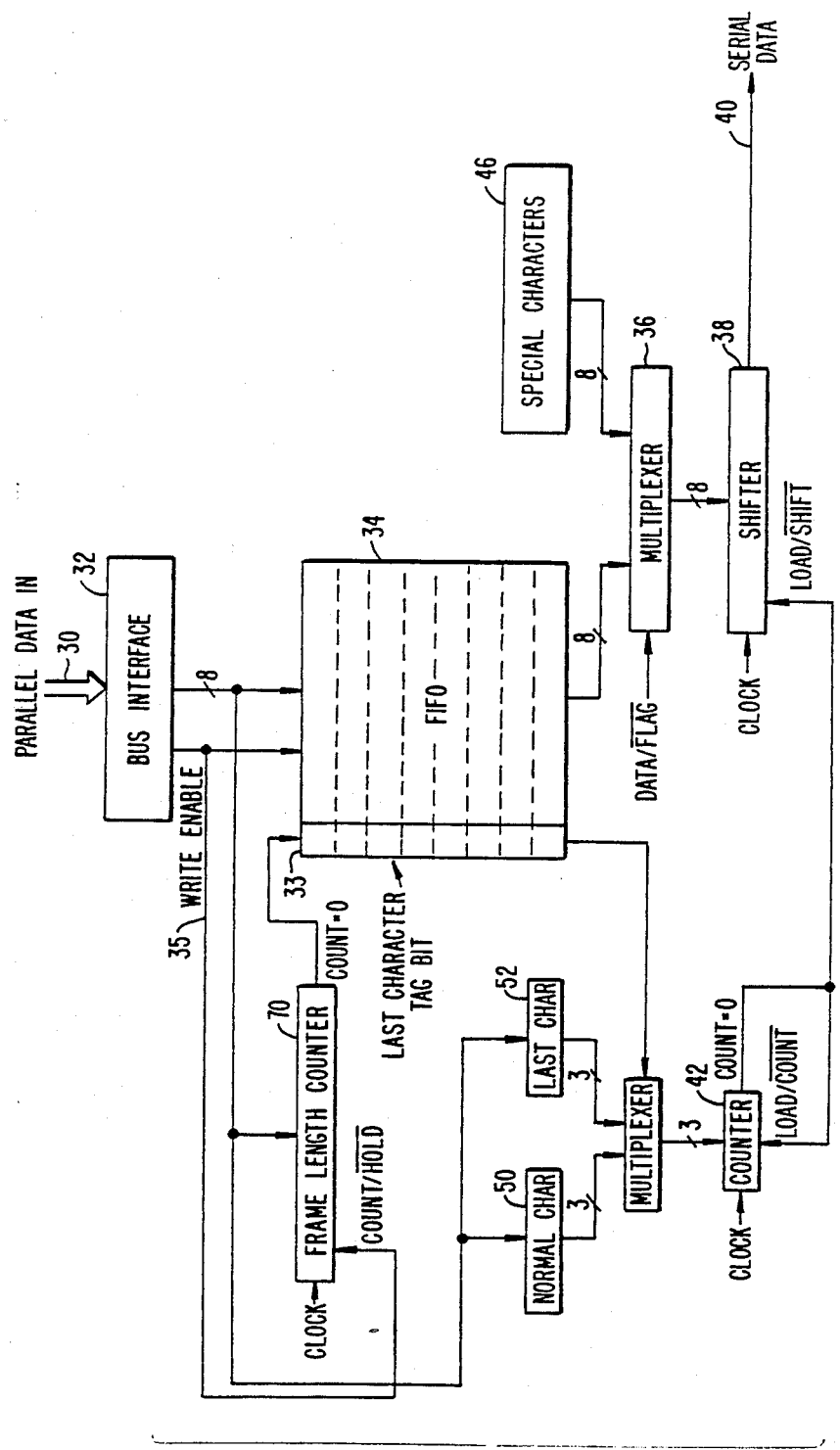
FIG._6.

SERIALIZER SYSTEM WITH VARIABLE CHARACTER LENGTH CAPABILITIES

BACKGROUND OF THE INVENTION

This invention relates in general to digital computer systems and in particular to the conversion of digital data between parallel and serial forms.

Digital data are represented by binary bits. Microprocessors typically operate on a number of bits of data in parallel. For example, a microprocessor chip may have 8 data lines connected to it so that 8 binary bits of digital information may be received or transmitted in parallel at any one time.

For communication between a microprocessor and a peripheral device, it is often expedient for digital data to be carried in a single line connecting them. In order to do this, the parallel data from the microprocessor must be converted to a serial bit stream for transmission over a cable.

In the example above of a microprocessor chip with 8 data lines, the 8 binary bits received or transmitted simultaneously form a character, so that the parallel data received or transmitted are in the form of a serial stream of 8 parallel bit characters. While it is convenient to manipulate data only in the form of characters all of which are of the same length, such approach is wasteful of the bandwidth of transmission channels. Thus, if a message to be transmitted is 17 bits long and each character transmitted has to be 8 bits in length, three characters will be required for conveying the message if a fixed character length protocol is used. In that case, 7 s of transimission capacity will be wasted. It is therefore desirable to adopt an approach where the characters transmitted can be of arbitrary character length. If the characters transmitted are of more than two different lengths, the microprocessor will have to keep track of the two or more different lengths of the characters, which will be cumbersome. For this reason, in conventional serializers, usually all of the characters in a message will have the same length except for the last character.

FIG. 1 illustrates a typical conventional message format using an arbitrary character length protocol. The message is made up of an opening flag 10 followed by the main body of the message itself comprising one or more normal characters 15 and one last character 19, and then concluded with a closing flag 20. The opening and closing flags are inserted in the transmitter portion of the serializer to indicate to the receiver portion of another serializer the beginning and end of the message. Typically the normal characters 15 are of fixed length (usually 8 bits or a byte). For messages of arbitrary bit length, the usual protocol is to divide it into multiples of fixed length normal characters 15 plus one final character 19 of some smaller length.

FIG. 2 illustrates the transmitter portion of a typical serializer for converting parallel data into serial data. Bit parallel, byte serial data 30 enter into the serializer through bus interface 32 and get written into FIFO (FIRST IN-FIRST-OUT) 34, and in turn go through a multiplexer 36 to be loaded successively into a shift register 38, whereby the parallel bits are shifted out as serial data 40. Since the serial data rate is in general slower than the parallel data rate, FIFO 34 is used as a storage buffer and staging area to hold the fast incoming parallel data before they have a chance of being converted into serial form. 10 The opening and closing flags of the message (see FIG. 1) are not present as they enter the serializer (see FIG. 2). These two flags are inserted into respectively the beginning and end of the serial stream by means of a special character generator 46 in conjunction with a multiplexer 36 as the message emerges from the FIFO.

Typically the normal characters are of length eight bits and, each time a character is loaded from the FIFO 34 into shift register 38, it must be shifted eight times before the next character is loaded. The number of shifts or the timing of loading the next character is controlled by a counter 42 which counts the character length corresponding to the character being shifted. Typically, the character length is initially written into a register such as register 44 by the CPU (Central processor unit) prior to the transfer of parallel data into the serializer. This character length is then loaded into counter 42 under CPU direction. In the case of a message with all its characters having the same fixed length, all its characters are thus normal characters. The CPU will first write the single character length into character length register 44 and initiate the loading of it into counter 42 at the beginning of the message transfer. Then the CPU will successively write all the rest of the characters in the message into FIFO 34. After this no further CPU action is required while the characters trickle out of the FIFO to be serialized.

In the case of a message of arbitrary bit length, conventional implementation normally requires CPU intervention to handle the odd length last character when it emerges from the FIFO to be loaded into the shift register. FIGS. 3(A), 3(B), 3(C) illustrate the critical timing problem when a message of arbitrary bit length is processed by the conventional serializer of FIG. 2. FIG. 3(A) illustrates the order in which the CPU writes or instructs. FIG. 3(B) illustrates the messsage 40 in serial bit form as it emerges from the shifter 38 and FIG. 3(C) illstrates the time window within which the CPU must complete its intervention to change the character length value in register 44.

Referring to FIGS. 3(A) and 3(B) in conjunction with FIG. 2, the CPU initially, as before, writes the character length of the normal character into the serializer before writing the normal characters into the FIFO. Since the character length stored in register 44 controls the shifting of shifter 38 by setting the value of counter 42, the value stored in register 44 cannot be changed until such value has set the counter 42 for shifting the next to last character. In other words the CPU must wait until all normal characters have come out of the FIFO before it is called upon again to reset the character length in counter 42 to that of the last character. This must be completed by the time counter 42 is called upon to control the shifter 38 to shift the correct number of times to convert the last character. The time window for setting the last character length is critical, as illustrated by FIG. 3(C), since only the time for the transmission of the next-to-last character is available. Such time-critical intervention by the CPU is undesirable since it may interfere with other CPU tasks and requires the CPU to track the retrieving of characters from the FIFO. If the CPU is not available to intervene, the retrieval of data from the FIFO may have to stop, which slows down the process. The FIFO is employed to free the CPU from having to track data flow to and retrieval from the FIFO. Requiring CPU intervention at the end of the transmitted message does not take full advantage of the time buffering function of the FIFO.

Accordingly, it is a primary object of the invention to provide a method and device which allows the transmission of messages of arbitrary bit length without requiring the normal CPU intervention at the end of the message.

SUMMARY OF THE INVENTION

The apparatus of this invention is for converting parallel data into serial data where the parallel data are arranged in a serial stream of characters each including a number of parallel bits. The characters include the same number of bits, said number of bits defining normal character length, except that the number of bits in the last character in the serial stream is different from the normal character length. The apparatus comprises first means for storing the serial stream of characters so that the characters are retrievable in the same order as that in the serial stream and means for retrieving each character from the storing means and serially shifting each character to form a serial bit stream. A second storing means is employed to store the number of bits in the last character; a third means is employed to store the normal character length. The apparatus further comprises means for tagging the characters with tags so that the last character is distinguishable from the characters of normal length by their tags and means responsive to the tag of a character for selecting between the normal character length and the number of bits in the last character and for controlling the retrieving and shifting means, so that the retrieving and shifting means shifts said character for the selected number of times.

Since each character carries along a tag indicating its length, and since such tag is used to control the number of times the characters shifted, no intervention by the CPU is necessary to change the character length in a time critical manner. Thus the CPU need not keep track of the data flow to and retrieval from the FIFO. No slowdown of the CPU or in the data flow will result and one can make full use of the advantage of a FIFO.

The various aspects of the present invention described herein are in the process of being commercially embodied in the Z16C30 CMOS Universal Serial Controller (USC) integrated circuit chip of Zilog, Inc., Campbell, Calif., assignee of the present application.

Additional objects, features and advantages of the present invention will become apparent from the following description of a preferred embodiment thereof, which description should be taken in conjunction with the accompanying drawings.

BRIEF DESCRIPTION OF THE DRAWINGS

FIG. 1 illustrates a message with arbitrary bit length;

FIG. 2 illustrates the handling of arbitrary bit length message by a typical conventional scheme;

FIGS. 3(A), 3(B), 3(C) are schematic timing diagrams to illustrate the critical timing problem when a message of arbitrary bit length is processed by the conventional serializer of FIG. 2.

FIG. 4 illustrates the scheme for handling a message of arbitrary bit length according to an alternative embodiment of the present invention;

FIGS. 5(A), 5(B), 5(C) are schematic timing diagrams of the scheme of FIG. 4;

FIG. 6 is a diagram illustrating a scheme for handling messages of arbitrary bit length according to the preferred embodiment of the present invention; and FIGS. 7(A), 7(B), 7(C) are schematic timing diagrams of the scheme of FIG. 6.

DETAILED DESCRIPTION OF THE PREFERRED EMBODIMENT

FIG. 4 illustrates a scheme for transmitting arbitrary bit-length messages to illustrate an alternative embodiment of the present invention. Under CPU control, parallel data are latched onto the bus interface 32 of the serializer 25. The parallel data 30 are typically 8 bits wide which could conveniently be the length of a normal character. Thus, the message according to that illustrated in FIG. 1 would be written into the serializer a character at a time.

Prior to the transmission of the message itself the CPU first transmits to the serializer the two possible character lengths corresponding to the normal characters as well as the last character. This it does by writing into two special registers in the serializer 25. Thus, normal character register 50 and last character register 52 hold respectively the character length of normal characters and that of the last character. The registers must have enough bits to represent up to the maximum number of bits a character can have. For example, for a maximum character length of 8-bit wide, three binary bits for each of the registers 50, 52 will be sufficient.

After registers 50, 52 have been set, the CPU begins the transfer of the message into serializer 25 through bus interface 32. Each character as it comes in is then written into a FIFO 34. As described above in the context of the conventional scheme, FIFO 34 is used as a storage buffer and staging area to hold the fast incoming parallel data before they have a chance of being converted into serial form. Except for the opening and closing flags which are absent when the message enters the transmitter portion of the serializer, the message (see FIG. 1) is carried into FIFO 34. These flags are inserted in their appropriate places in the serial stream later.

One feature of the invention requires that the serializer 25 be able to distinguish the last character from the normal characters. Thus each character is tagged by an extra bit so that a ZERO, which is the default, designates a normal character and a ONE designates the last character. This tag bit 33 is carried along with each character through FIFO 34. As each character enters the bus interface 32, the CPU issues a write enable strobe through a line 35. The leading edge of the write enable strobe latches both the character and its tag bit 33 into the FIFO 34. The tag bit 33 comes from an EOF (End-of-Frame) bit register 60 which holds a ZERO for tagging a normal character and a ONE for tagging the last character about to be written into the FIFO. Normally, the EOF bit register 60 is at the default value ZERO. After the writing of each character into the FIFO 34, the trailing edge of the write enable strobe in line 35 is use to clear the EOF bit register through an input 61 back to the default value ZERO. In the case of the last character, prior to its transmission to the serializer 25, the EOF bit register 60 is set by the CPU to a ONE. This is done through input lines 63 which represent both data and strobe lines. The ONE in the EOF bit register 60 is used in turn to tag the last character as it is written into the FIFO from the bus interface 32. Thus the rising edge of the write enable strobe in line 35 latches the last character from bus interface 32 into the FIFO 34 and, at the same time, latches a ONE into FIFO 34 in order to tag the last character as it is written into FIFO 34. After the last character and the tag bit for the last character have been written, the trailing edge of the write enable strobe signal in the line 35 is used to reset the EOF bit register 60 back to the default value ZERO. Thus, in the alternative embodiment, the CPU must keep track of the timing of the loading of the last character into the FIFO in order to correctly tag the last character and to reset the EOF register 60.

Meanwhile, just before the first normal character emerges from FIFO 34, device logic (not shown) switches a multiplexer 36 to load an opening flag from the special character generator 46 to a shift register 38. Shift register 38 continuously shifts the 8-bit data loaded into it to the right and emerge as serial data 40. After the insertion of the opening flag back into the serial stream, device logic switches multiplexer 36 to load shift register 38 from FIFO 34. The tag bit of the first normal character emerging out of the FIFO 34 is read by multiplexer 54. The first normal character itself is loaded into shifter 38. The tag bit read by a second multiplexer 54 is used to select between the lengths of the normal and last characters from registers 50, 52, and loads the normal character length from register 50 into counter 42. The output of counter 42 is used to control shifter 38. For example, for a normal character length of 8 bit, a binary equivalent of 7 will be loaded into counter 42. The output of counter 42 decreases by one every clock cycle. As long as the output count is not zero, the shifter 38 continues to shift the character loaded into it out in serial fashion. When the output count of counter 42 reaches zero, it is used to signal the loading of the next character from the FIFO 34 into shifter 38. The process repeats itself until the last character comes out of the FIFO 34. The tag bit of the last character similarly is read by multiplexer 54 and is used to select instead the last character length stored in register 52; the last character itself is loaded into shifter 38. In this way the countdown in counter 42 corresponding to the length of the last character will enable shifter 38 to shift precisely the same length out into serial data 40 before the next loading of shifter 38 occurs.

FIGS. 5(A), 5(B), 5(C) show the timing of the scheme of FIG. 4 in a manner similar to FIGS. 3(A)-3(C) for the scheme of FIG. 2. FIG. 5(B) shows the time series of serial data 40. FIG. 5(A) shows that CPU initially writes the normal character length and the last character length into the serializer's registers 50, 52. Then it writes a sequence of characters, together with their tag bits, beginning from the first into FIFO 34. Since the tag bit for normal characters is simply the default value ZERO, there is no need for the CPU to set the default tag bit in the EOF bit register. Just prior to writing the last character from the interface 32 into the FIFO, the CPU first writes the last character tag into the EOF bit register 60 as described above. Then it writes the last character together with the tag bit from the EOF bit register into FIFO 34. All this takes place relatively quickly at the beginning of the serial stream. Thereafter, while the message is being processed through the FIFO and shifter 38 which may take a considerable time period, the CPU is not called upon to do anything else. FIG. 5(C) illustrates the wide time window for setting the last character length in register 52 in contrast to the prior art scheme of FIG. 2 and FIGS. 3(A)-3(C). Thus it can be seen the present invention does not require time critical CPU intervention, and the full advantage of FIFO is preserved.

The same advantageous features are also possessed by the preferred embodiment of the present invention. FIG. 6 illustrates the preferred scheme for marking the last character. The structure and operation of FIG. 6 is similar to FIG. 4 except in FIG. 6, a frame length counter 70 is used in place of the EOF bit register 60 of FIG. 4. The difference is, prior to the commencement of the message, the CPU not only writes the normal and last character lengths into their respective registers, but also writes the total number of characters in the message into frame length counter 70. This information is then used by serializer 25 to keep track of the last character instead of using the CPU to do so as in the scheme of FIG. 4. As before, as each character enters the FIFO, it is tagged with an extra bit in order to label it as a normal character or the last character. The tag bit has default zero corresponding to a normal character. Meanwhile each write enable 35 enables the writing of a character into the FIFO and also decreases the content of counter 70 by one. When the last character comes out of the bus interface 32, frame length counter 70 will have an output count of zero which will set the bit tagged onto the last character to a ONE. In this way, the normal characters and last character going into FIFO 34 are tagged appropriately, similar to the scheme illustrated in FIG. 4.

FIG. 7 illustrates the timing of the preferred embodiment of FIG. 6. As before, FIG. 7(B) illustrates the time series of serial data 40. FIG. 7(A) illustrates that the CPU initially writes the frame length into frame length counter 70, normal character length into register 50 and last character length into register 52. Then it writes the sequence from first character right up to the last character into FIFO 34. FIG. 7(C) again shows that the time window for setting last character length is very wide, which again do not require time-critical CPU intervention when the last character emerges out of the FIFO.

The preferred embodiment of FIG. 6 is advantageous over the alternative embodiment of FIG. 4 in that it requires even less attention from the CPU. Once registers 50, 52 and counter 70 have been loaded, counter 70 automatically keeps track of the loading of each character into FIFO 34. Upon the loading of the last character in the message into the FIFO, counter 70 counts to zero, thereby causing the tag bit of the last character to be set to a ONE. All this is done automatically without requiring the attention of the CPU. Hence the CPU need not keep track of the timing of the loading of the last character in the message into the FIFO. In contrast, in the alternative embodiment of FIG. 4, the CPU must still keep track of the timing of the loading of the last character in the message into the FIFO in order to correctly tag the last character so as to distinguish it from other normal characters.

While the invention has been illustrated with parallel data eight bit wide, and normal character of eight bit length, it would be obvious to adapt the invention to other choices of data width and character length.

Although the various aspects of the present invention have been described with respect to its preferred embodiment, it will be understood that the invention is to be protected within the scope of the appended claims.

I claim:

1. An apparatus for converting parallel data into serial data, said parallel data arranged in a serial stream of characters each including a number of parallel bits, wherein the characters include the same number of bits, said number of bits defining the normal character length, except that the number of bits in the last character in the serial stream is different from the normal character length, said apparatus comprising:

first means for storing the serial stream of characters so that the characters are retrievable in the same order as that in the serial stream;

means for retrieving each character from the storing means and serially shifting each character to form a serial bit stream;

second means for storing the number of bits in the last character;

third means for storing the normal character length;

means for tagging the characters with tags so that the last character is distinguishable from the characters of normal length by their tags;

means responsive to the tag of a character for selecting between the normal character length and the number of bits in the last character and for controlling the retrieving and shifting means, so that the retrieving and shifting means shifts said character for the selected number of times.

2. The apparatus of claim 1, wherein said means for tagging supplies a tag bit to the first storing means to tag the last character.

3. The apparatus of claim 2, wherein said means for tagging supplies to the first storing means a tag bit to tag each character, and wherein the tag bit for the last character has a different value than that for other characters.

4. The apparatus of claim 2, wherein said tagging means is a fourth means for storing the tag bit for the last character, said tagging means being controlled by a processor for supplying the tag bit to the first storing means for tagging the last character when the last character is being stored into the first storing means.

5. The apparatus of claim 1, wherein the serial character stream is stored serially into the first storing means, wherein said tagging means is a counter for storing the number of characters in the serial character stream, said counter being synchronized with the serial storing of the serial character stream into the first storing means so that the counter counts to a predetermined number, the last character is being loaded into the first storing means, said counter also for tagging the last character when the counter counts to said predetermined number.

6. The apparatus of claim 5, wherein said means for tagging supplies a tag bit to the first storing means for tagging the last character.

7. The apparatus of claim 6, wherein said means for tagging supplies to the first storing means a tag bit to tag each character, and wherein the tag bit for the last character has a different value than that for other characters.

8. A method for converting parallel data into serial data, said parallel data arranged in a serial stream of characters each including a number of parallel bits, wherein the characters include the same number of bits, said number of bits defining the normal character length, except that the number of bits in the last character in the serial stream is different from the normal character length, said method comprising:

storing the serial stream of characters so that the characters are retrievable in the same order as that in the serial stream;

storing the number of bits in the last character;

storing the normal character length;

tagging the characters with a tag so that the last character is distinguishable from the characters of normal length;

retrieving serially the characters in the serial character stream, determining whether each retrieved character is the last character, selecting between the stored number of bits in the last character and the normal character length and serially shifting such retrieved character for the selected number of times to form a serial bit stream.

9. The method of claim 8, wherein said tagging step supplies a tag bit to the last character.

10. The method of claim 9, wherein said tagging step supplies a tag bit to each character, and wherein the tag bit for the last character has a different value than that for other characters.

* * * * *